(12) United States Patent
Bronner et al.

(10) Patent No.: US 6,200,834 B1
(45) Date of Patent: Mar. 13, 2001

(54) PROCESS FOR FABRICATING TWO DIFFERENT GATE DIELECTRIC THICKNESSES USING A POLYSILICON MASK AND CHEMICAL MECHANICAL POLISHING (CMP) PLANARIZATION

(75) Inventors: Gary B. Bronner, Stormville, NY (US); Jeffrey Peter Gambino, Westford, VT (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/359,290
(22) Filed: Jul. 22, 1999
(51) Int. Cl.[7] ................................................ H01L 21/335
(52) U.S. Cl. ............................ 438/142; 438/303; 438/305
(58) Field of Search ..................................... 438/142, 145, 438/257, 239, 241, 303, 143, 144, 240, 302

(56) References Cited

U.S. PATENT DOCUMENTS 5,668,035 * 9/1997 Fang et al. ............................ 438/239
6,015,730 * 1/2000 Wang et al. ........................... 438/241
6,030,876 * 2/2000 Koike .................................... 438/303
6,037,222 * 3/2000 Huang et al. ......................... 438/257

* cited by examiner

*Primary Examiner*—David Nelms
*Assistant Examiner*—Dung A Le
(74) *Attorney, Agent, or Firm*—McGinn & Gibb, PLLC; Daryl K. Neff, Esq.

(57) ABSTRACT

A method of forming a semiconductor device, including forming a substrate with a memory array region and a logic device region, growing a thick gate dielectric over the substrate, forming a gate stack, including a first polysilicon layer, over the thick gate dielectric for the memory array region, forming a thin gate dielectric on the substrate over the logic device region, wherein layers of the gate stack in the memory array region protect the thick gate oxide during the forming of the thin gate dielectric, forming a second polysilicon layer for the gate stack in the logic device region, to produce a resulting structure, wherein a thickness of the second polysilicon layer is at least as thick as the gate stack in the memory array region, planarizing the structure using chemical mechanical polishing (CMP), and patterning the gate stacks in said memory array region and the logic device region.

27 Claims, 3 Drawing Sheets

PROCESS FOR FABRICATING TWO DIFFERENT GATE DIELECTRIC THICKNESSES USING A POLYSILICON MASK AND CHEMICAL MECHANICAL POLISHING (CMP) PLANARIZATION

BACKGROUND OF THE INVENTION

1. Field of the Invention

The present invention generally relates to a method for producing a semiconductor device, and more particularly to a method of reducing topography variation from a polysilicon mask using chemical mechanical polishing (CMP) operation in producing the semiconductor device.

2. Description of the Related Art

Merged dynamic random access memory (DRAM)-logic circuits (e.g., so-called "hybrid circuits") offer possible advantages in terms of performance. However, thin gate dielectrics are required in the logic circuits to achieve high performance (e.g., higher speeds), whereas thick gate oxides are required in the DRAM arrays to achieve high yields.

In a conventional process, as described, for example, in U.S. Pat. No. 5,668,035, incorporated herein by reference, and as shown in FIGS. 6A–6C, a polysilicon mask is used to protect the thick gate dielectric in a DRAM Array while growing the thin gate dielectric in the logic circuits.

Specifically, as shown in FIG. 6A, using conventional photolithographic techniques a photoresist layer 18 is spin-coated on a first polysilicon layer 16 and patterned leaving portions of the photoresist over a memory device area 5 while exposing the polysilicon layer 16 over a logic device area 3.

Then, the first polysilicon layer 16 is etched to the gate oxide layer 14 over the logic device area 3, as shown in FIG. 6A. The etching is performed using anisotropic plasma etching, for example, in a reactive ion etching (RIE), and using an etchant gas such as chlorine ($Cl_2$) and a carrier gas, such as argon (Ar). This results in selective etching of the polysilicon layer 16 to the gate oxide 14.

The first gate oxide layer 14 is selectively removed in the logic device area 3 using wet etching, for example, by dip etch in a dilute solution of hydrofluoric (HF) acid and water.

Referring now to FIG. 6B, the photoresist layer 18 is removed, a second gate oxide layer 15, which is thinner than the first gate oxide 14, is formed by thermal oxidation over the logic device area 3. This thermal oxidation also forms a silicon oxide layer 17 on the polysilicon layer 16, as shown in FIG. 6B.

Referring now to FIG. 6C, a conformal second polysilicon layer 20 is deposited over the second gate oxide layer 15 in the logic device area 3, and over the oxide layer 17 that was formed on the first polysilicon layer 16 during the thermal oxidation. Preferably, the second and first polysilicon layers, 16 and 20, are deposited to essentially the same thickness. This provides for the concurrent etching of polysilicon layers 16 and 20 over the first and second gate oxide layers 14 and 15, respectively, without resulting in over-etching one of the other device area into the silicon substrate 10. The second polysilicon layer 20 is also doped with an N-type dopant by ion implantation. The independent doping of polysilicon layers 16 and 20, from which the FET gate electrodes are formed, provides a means for independently controlling doping in both gate electrodes.

However, the above process results in a very non-planar structure. This nonplanarity will greatly reduce the process window for lithography at dimensions of 0.25 μm and below.

An additional problem is associated with forming self-aligned contacts in the array. This requires an SiN cap on top of the gates in the array. However, the SiN cap must be removed from the logic regions (e.g., SiN caps enhance diffusion through gate oxides, resulting in threshold voltage shifts for FETs) using an extra mask, thereby increasing the cost of the integrated circuit.

SUMMARY OF THE INVENTION

In view of the foregoing problems of the conventional methods, an object of the present invention is to provide a method for fabricating two different gate dielectric thicknesses using a polysilicon mask and chemical mechanical polishing (CMP).

In a first aspect of the present invention, a method of making a semiconductor device, includes forming a substrate with a memory array region and a logic device region, growing a thick gate dielectric over the substrate, forming a gate stack, including a first polysilicon layer, over the thick gate dielectric for the memory array region, forming a thin gate dielectric on the substrate over the logic device region, wherein layers of the gate stack in the memory array region protect the thick gate oxide during the forming of the thin gate oxide, forming a second polysilicon layer for the gate stack in the logic device region, to produce a resulting structure, wherein a thickness of the second polysilicon layer is at least as thick as the gate stack in the memory array region, planarizing the structure using chemical mechanical polishing (CMP), and patterning the gate stacks in the memory array region and the logic device region.

With the method of the present invention, a planar structure is achieved for gate stack patterning. Additionally, a gate cap is formed in the array, which is required for self-aligned contacts, but not in the logic regions where the gate cap makes it more difficult to form dual work-function gates. Logic areas not covered by an SiN mask processing and provide dual work-function gates without the need of an extra blockout mask. The end structure is well-planarized, and gate stacks with different thicknesses are achieved with good controllability. That is, thin oxide gates and thick oxide gates can be obtained on the same chip.

BRIEF DESCRIPTION OF THE DRAWINGS

The foregoing and other objects, aspects and advantages will be better understood from the following detailed description of a preferred embodiment of the invention with reference to the drawings, in which:

FIG. 1 illustrates forming a memory gate stack on a substrate having a logic device region and a memory array region;

FIG. 2 illustrates the processing of the structure of FIG. 1 including selectively removing the memory gate stack materials over the logic device region;

FIG. 3 illustrates processing the logic gate stack of the structure of FIG. 2 including forming a polysilicon 300 over a thin gate dielectric 200; and FIG. 4 illustrates processing of the gate stacks of the structure of FIG. 3 including patterning the same, and ion implantation, and then a silicide process;

DETAILED DESCRIPTION OF PREFERRED EMBODIMENTS OF THE INVENTION

Figure 1:
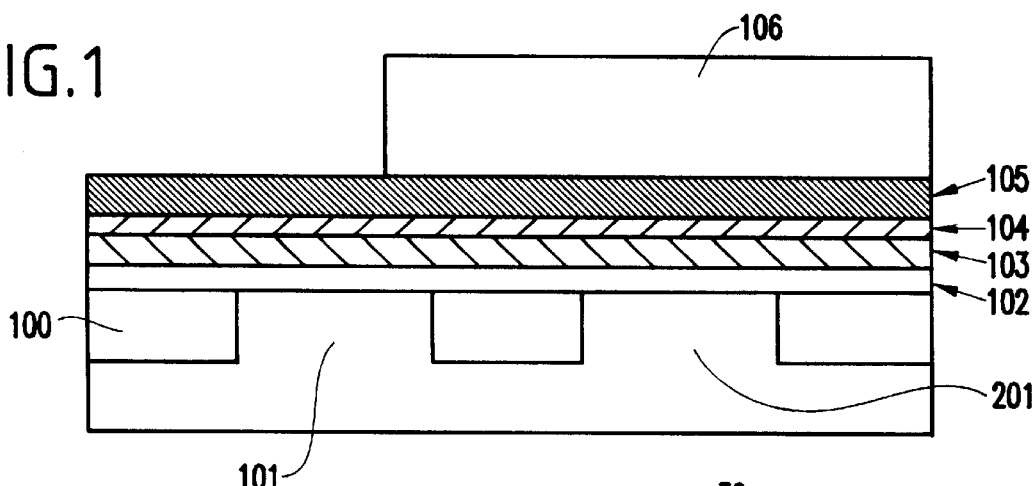
FIGS. 1–4 illustrate a structure formed by a process of forming a semiconductor device according to a preferred embodiment of the present invention, and more specifically.

Referring now to the drawings, and more particularly to FIGS. 1–5, a method to reduce the topography from a polysilicon mask is shown by using, for example, chemical mechanical polishing (CMP).

A problem of using CMP for this application is that there is a requirement of good thickness control on the gate polysilicon thickness, to minimize the variation in over-etch during gate stack patterning. The invention, which preferably uses a polish stop layer of $Si_xN_y$ or $SiO_2$ to control the gate polysilicon thickness, solves this problem, as described below.

Figure 5:
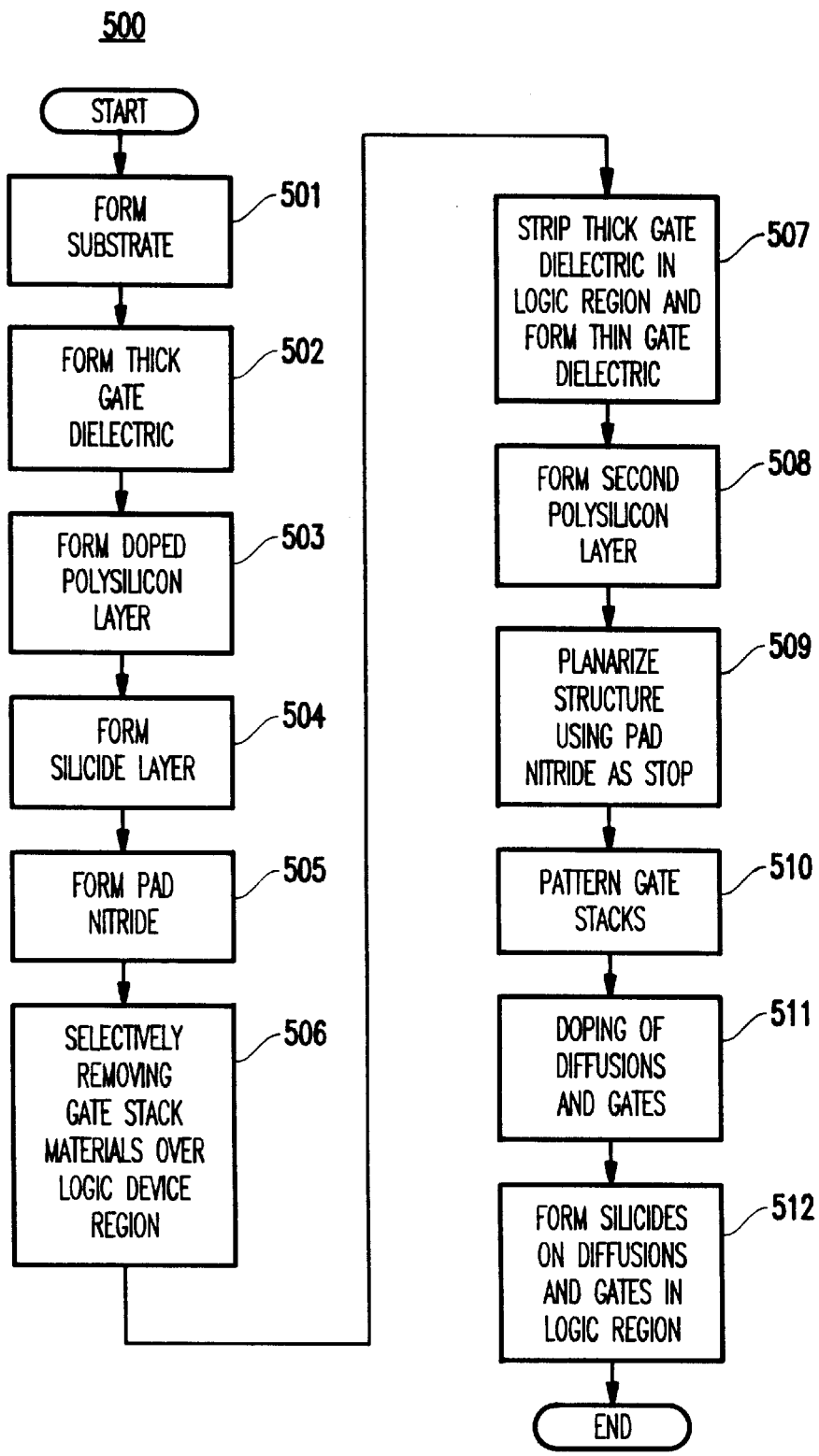
FIG. 5 illustrates a flowchart of the process of the method of the invention.
Figure 6A:
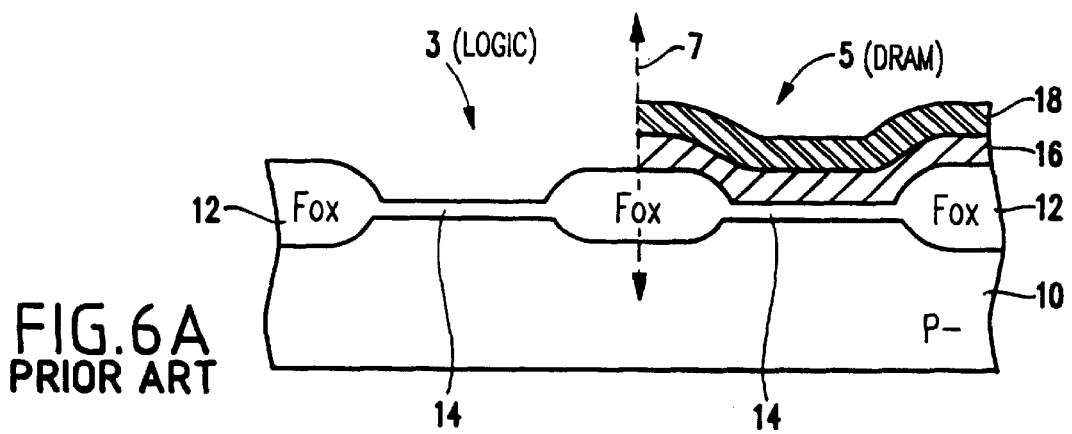
FIGS. 6A–6C illustrate a conventional process of forming a semiconductor device.
Figure 6B:
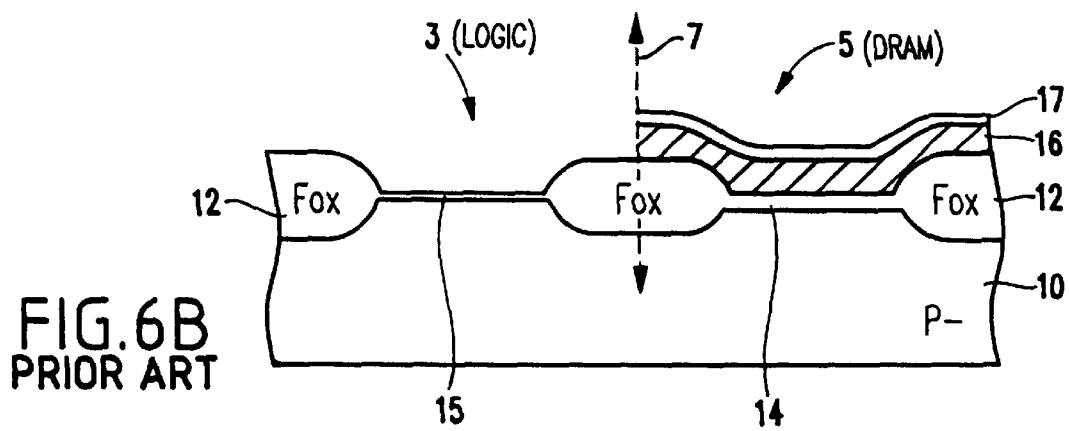
Figure 6C:
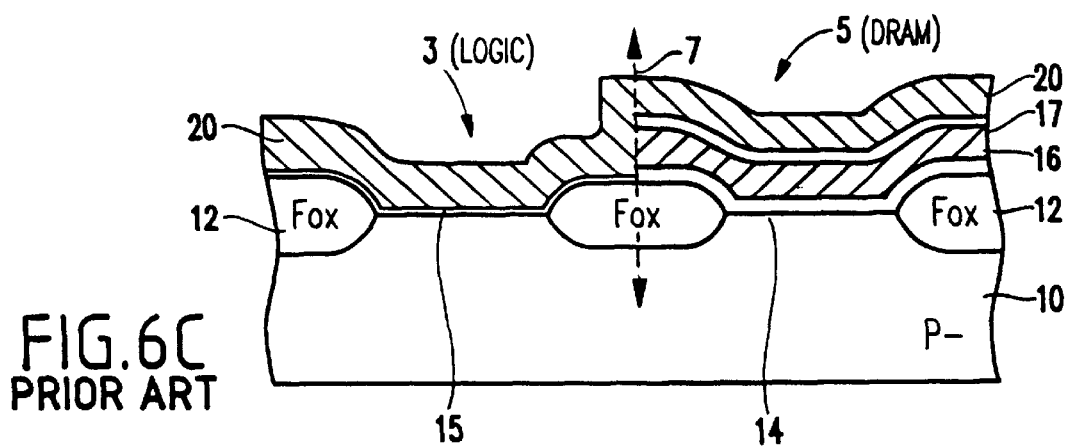

Referring to FIG. 1 and the flowchart of FIG. 5, a starting substrate (e.g., formed of silicon) includes, for example, a logic device region 101 and a memory array region 201, with shallow trench isolation (STI) 100, and trench capacitors (not shown), formed, for example, in a silicon substrate (step 501).

A thick gate dielectric 102 is formed, preferably having a thickness within a range of about 5 nm to about 50 nm, and more preferably about 7 nm (step 502). The dielectric can be $SiO_2$ or $SiO_xN_y$, formed by thermal oxidation, nitridation and/or the like.

Thereafter, a doped (e.g., preferably As- or P-doped) polysilicon 103 is formed (e.g., preferably deposited by chemical vapor deposition (Chemical Vapor Deposition (CVD)) on the thick gate dielectric 102 (step 503). Polysilicon 103 preferably has a thickness within a range of about 20–200 nm, and more preferably about 50 nm.

Thereafter, a silicide (e.g., preferably $WSi_2$) 104 is formed (e.g., preferably deposited by CVD or by sputtering). The silicide 104 preferably has a thickness within a range of about 20 nm to about 100 nm, and more preferably about 50 nm (step 504).

Then, a pad nitride 105 (e.g., $Si_3N_4$) is formed (e.g., preferably deposited by CVD). Nitride 105 preferably has a thickness within a range of about 20 nm to about 300 nm, and more preferably about 150 nm (step 505). It is noted that the above-mentioned $WSi_2$ and $Si_3N_4$ layers are optional, and are not required to practice the invention. A resist 106 is formed over the memory array portion of the gate structure. Steps 502 through 505 constitute steps for forming a gate stack.

Figure 2:
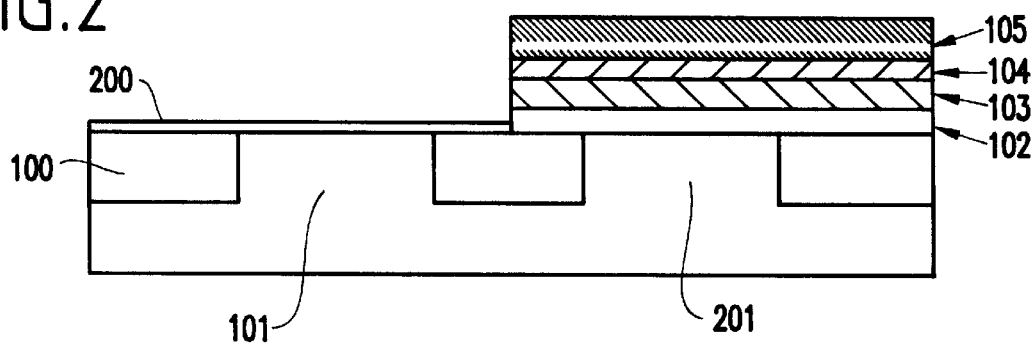

Referring to FIG. 2, the gate stack materials over the logic regions 101 are removed by lithography and etching (e.g., reactive ion etching (RIE)) using F and Cl-based etchants) (step 506).

After removing the resist 106, the thick gate dielectric 102 (e.g., oxide) is stripped in the logic regions (e.g., via hydrofluoric (HF) wet etch or the like), and a thin gate dielectric 200 is formed (e.g., grown or deposited) preferably having a thickness within a range of about 2 nm to about 20 nm, and more preferably about 5 nm (step 507). The dielectric 200 may be $SiO_2$, $SiO_xN_y$, SiN, $Ta_2O_5$, and/or $Al_2O_3$. It is noted that the gate stack layers in the array regions 201 protect the thick gate oxide 102 during the strip and growth of the thin gate oxide 200.

Figure 3:
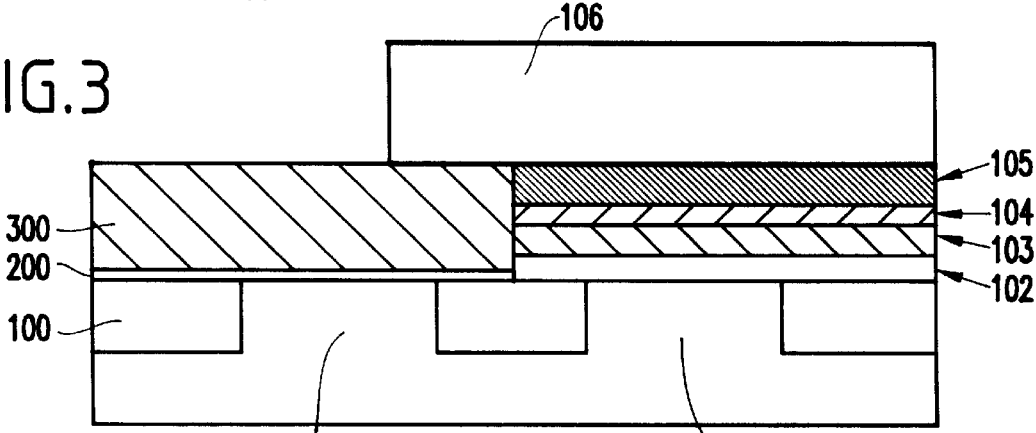

Referring to FIG. 3, a second polysilicon layer 300 (e.g., preferably undoped) is formed (e.g., preferably deposited by CVD or the like), and will be used for the gates in the logic device regions (step 508). The thickness of the second polysilicon layer 300 should be at least as thick as the total gate stack in the memory array regions, in order to achieve planarity during a subsequent polishing step.

Then, the structure is planarized using chemical mechanical polishing (CMP), using the pad nitride (e.g., $Si_3N_4$) layer 105 in the memory array region 201 as a polish stop (step 509). If there is no $Si_3N_4$ layer, then the thin gate dielectric 200 that forms on top of the first polysilicon layer 103 can be used as a polish stop.

Figure 4:
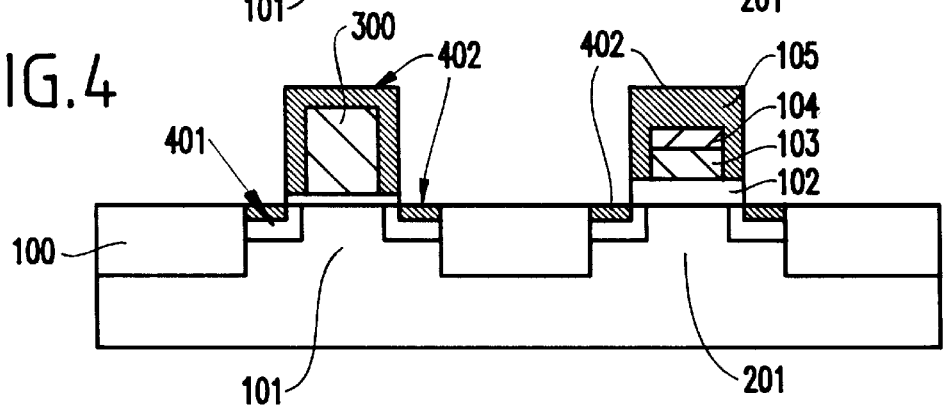

Referring to FIG. 4, the gate stacks are patterned using lithography and RIE (step 510). It is noted that if a hard mask is required for RIE, then another dielectric, such as $SiO_2$ or $Si_3N_4$ can be deposited after the CMP step to serve as the hard mask.

Thereafter, doping of all diffusions 401 and of gates 300 in the logic regions is achieved by ion implantation and annealing (step 511).

Silicides 402 are formed on all diffusions as well as gates in the logic regions by a standard silicide process, metal deposition, annealing, and wet etch (step 512).

The above-described process according to the present invention has a number of advantages. First, a planar structure is achieved for gate stack patterning. Additionally, a gate cap is formed in the array (which is required for self-aligned contacts) but not in the logic regions (where the gate cap makes it more difficult to form dual work function gates).

Logic areas are not covered by a cap nitride (e.g., SiN mask), thereby saving a mask step (e.g., a blockout mask) during implants for dual work-function gates. The end structure is well-planarized.

Further, gate stacks with different thicknesses are achieved with good controllability. That is, thin oxide gates and thick oxide gates can be obtained on the same chip.

The invention is not limited to the above process and/or implementation. Any process will find benefit with the invention, which requires dual gate oxides and/or two different gate stacks. For example, the manufacturing of a n embedded flash memory will find great benefit with the method of the present invention.

While the invention has been described in terms of a preferred embodiment, those skilled in the art will recognize that the invention can be practiced with modification within the spirit and scope of the appended claims.

What is claimed is:

1. A method of forming a semiconductor device, comprising:

forming a substrate with a memory array region and a logic device region;

growing a thick gate dielectric over said substrate;

forming a gate stack, including a first polysilicon layer, over the thick gate dielectric for the memory array region;

removing the thick gate dielectric over said logic device region;

forming a thin gate dielectric on said substrate over said logic device region, wherein layers of the gate stack in the memory array region protect the thick gate oxide during the forming of the thin gate dielectric;

forming a second polysilicon layer for a gate stack in the logic device region, to produce a resulting structure, wherein a thickness of the second polysilicon layer is at least as thick as the gate stack in the memory array region;

planarizing the structure using chemical mechanical polishing (CMP); and patterning the gate stacks in said memory array region and said logic device region such that a planar surface is provided during all of said patterning of the gate stacks and said gate stacks each have a planar gate stack.

2. The method according to claim 1, wherein said forming said gate stack comprises:

forming said first polysilicon layer over said thick gate dielectric, said first polysilicon being a doped polysilicon;

forming a silicide over said first polysilicon layer;

forming a pad nitride over said silicide; and removing materials of the gate stack over the logic device region by lithography and etching.

3. The method according to claim 1, wherein said gate stack has a cap nitride layer, and wherein said planarizing comprises using a cap nitride layer in the memory array region as a polish stop.

4. The method according to claim 1, wherein the thin gate dielectric is formed on top of the first polysilicon layer, and is used as a polish stop during CMP.

5. The method according to claim 1, wherein said patterning is performed using lithography and reactive ion etching (RIE), said method further comprising:

doping of diffusions and gates in the logic device region by ion implantation and annealing; and forming silicides on the diffusions and the gates in the logic device region.

6. The method according to claim 1, wherein said thick gate dielectric has a thickness within a range of about 5 nm to about 50 nm.

7. The method according to claim 1, wherein said thick gate dielectric has a thickness of about 7 nm.

8. The method according to claim 1, wherein said thick gate dielectric is at least one of $SiO_2$ and $SiO_xN_y$.

9. The method according to claim 1, wherein said first polysilicon layer is at least one of As- and P-doped polysilicon, and has a thickness within a range of about 20 nm to about 200 nm.

10. The method according to claim 9, wherein said first polysilicon layer has a thickness of about 50 nm.

11. The method according to claim 2, wherein said silicide comprises $WSi_2$ having a thickness within a range of about 20 nm to about 100 nm.

12. The method according to claim 11, wherein said silicide has a thickness of about 50 nm.

13. The method according to claim 2, wherein said cap nitride has a thickness within a range of about 20 nm to about 300 nm.

14. The method according to claim 13, wherein said cap nitride has a thickness of about 150 nm.

15. The method according to claim 1, wherein the thin gate dielectric has a thickness within a range of about 2 nm to about 20 nm.

16. The method according to claim 15, wherein said thin gate dielectric has a thickness of 5 nm, and comprises at least one of $SiO_2$ and $SiO_xN_y$, SiN, $Ta_2O_5$, and $Al_2O_3$.

17. The method according to claim 1, wherein said second polysilicon layer comprises an undoped polysilicon layer deposited by chemical vapor deposition (CVD), and is for the gates in the logic device region.

18. The method according to claim 1, wherein a thickness of the second polysilicon layer is at least as thick as the total gate stack in the memory array region.

19. The method according to claim 2, wherein said pad nitride comprises $Si_3N_4$ and functions as a polish stop.

20. The method according to claim 1, wherein said thin gate dielectric formed on top of the first polysilicon layer is used as a polish stop.

21. The method of claim 1, wherein said gate stacks respectively have two different gate dielectric thicknesses, while maintaining a planar surface for all lithography processes and wherein said gate stack over the thick gate dielectric is planar with said gate stack over said thin gate dielectric.

22. A method of forming a semiconductor device having two different gate dielectric thicknesses, comprising:

forming a substrate with a first region and a second region;

growing a thick gate dielectric over said substrate;

forming a gate stack, including a first polysilicon layer, over the thick gate dielectric for the first region;

removing the thick gate dielectric over said second region;

forming a thin gate dielectric on said substrate over said second region, wherein layers of the gate stack in the first region protect the thick gate oxide during the forming of the thin gate dielectric;

forming a second polysilicon layer for a gate stack in the second region, to produce a resulting structure, wherein a thickness of the second polysilicon layer is at least as thick as the gate stack in the first region; and planarizing the structure using chemical mechanical polishing (CMP) such that a planar surface is provided during all of said patterning of the gate stacks and said gate stacks each have a planar gate stack.

23. The method according to claim 22, further comprising:

patterning the gate stacks in said first region and said second region.

24. The method according to claim 22, wherein said first region comprises a memory array region and said second region comprises a logic device region.

25. The method according to claim 22, wherein forming said gate stack comprises:

forming said first polysilicon layer over said thick gate dielectric, said first polysilicon being a doped polysilicon;

forming a silicide over said first polysilicon layer;

forming a pad nitride over said silicide; and removing materials of the gate stack over the second region by lithography and etching.

26. A method of forming an embedded flash memory, comprising:

forming a substrate with a first region and a second region;

growing a thick gate dielectric over said substrate;

forming a gate stack, including a first polysilicon layer, over the thick gate dielectric for the first region;

removing the thick gate dielectric over said second region;

forming a thin gate dielectric on said substrate over said second region, wherein layers of the gate stack in the first region protect the thick gate oxide during the forming of the thin gate dielectric;

forming a second polysilicon layer for a gate stack in the second region, to produce a resulting structure; and planarizing the structure using chemical mechanical polishing (CMP) such that a planar surface is provided during all of said patterning of the gate stacks and said gate stacks each have a planar gate stack.

27. The method according to claim 26, further comprising:

patterning the gate stacks in said first region and said second region, wherein a thickness of the second polysilicon layer is at least as thick as the gate stack in the first region.

\* \* \* \* \*